(12) United States Patent
Conway

(10) Patent No.: US 7,447,983 B2
(45) Date of Patent: Nov. 4, 2008

(54) SYSTEMS AND METHODS FOR DECODING FORWARD ERROR CORRECTING CODES

(75) Inventor: Adrian Evans Conway, Weston, MA (US)

(73) Assignee: Verizon Services Corp., Arlington, VA (US)

( * ) Notice: Subject to any disclaimer, the term of this patent is extended or adjusted under 35 U.S.C. 154(b) by 497 days.

(21) Appl. No.: 11/128,986

(22) Filed: May 13, 2005

(65) Prior Publication Data

US 2006/0259849 A1 Nov. 16, 2006

(51) Int. Cl.
*H03M 13/00* (2006.01)

(52) U.S. Cl. .................. 714/795; 714/752; 714/776; 714/794; 714/796; 375/262; 375/341; 370/252; 370/516

(58) Field of Classification Search ................ 714/752, 714/776, 786, 795, 794, 796; 370/252, 516; 375/262, 341

See application file for complete search history.

(56) References Cited

U.S. PATENT DOCUMENTS

| | | | |
|---|---|---|---|
| 4,726,019 A * | 2/1988 | Adelmann et al. .......... | 370/474 |
| 6,085,158 A | 7/2000 | Naka et al. | |
| 6,366,959 B1 | 4/2002 | Sidhu et al. | |
| 6,952,407 B2 * | 10/2005 | Burke ......................... | 370/252 |
| 7,058,568 B1 * | 6/2006 | Lewis ......................... | 704/214 |
| 2004/0047369 A1 * | 3/2004 | Goel ........................... | 370/516 |
| 2006/0107187 A1 * | 5/2006 | Hannuksela ................. | 714/776 |
| 2006/0133533 A1 * | 6/2006 | Khandekar et al. .......... | 375/279 |

OTHER PUBLICATIONS

A.E. Conway, Forward Delay Protection of Time-Critical Traffic in ATM Networks with FEC, in Proc. IEEE Global Telecommunications Conference, San Francisco, CA, pp. 1200-1206, Nov. 1994.
Improved packet loss recovery using late frames for prediction-based speech coders, Gournay, P.; Rousseau, F.; Lefebvre, R.; Acoustics, Speech, and Signal Processing, 2003. Proceedings. (ICASSP '03). 2003 IEEE International Conference on , vol. 1.
A packet loss recovery method using packet arrived behind the playout time for CELP decoding, Serizawa, M.; Ito, H.; Acoustics, Speech, and Signal Processing, 2002. Proceedings. (ICASSP '02). IEEE International Conference on , vol. 1 , May 13-17.

(Continued)

Primary Examiner—Esaw Abraham

(57) ABSTRACT

Systems and methods for improving the performance of decoders of forward error correcting codes use the information contained in late packet arrivals to update (or recompute) the state of the decoder. These systems and methods are generally applicable to decoders that maintain state information in decoding successive bits or information frames so as to improve the performance (i.e., the bit error rate) of the decoder since the recomputed state is exactly the state that the decoder would have had if the information contained in the late packet had originally arrived on time and been decoded in a usual manner. In effect, the updating of the decoder state following a late packet arrival terminates the propagation in time of the effect of the late packet erasure on the state of the decoder.

17 Claims, 3 Drawing Sheets

OTHER PUBLICATIONS

A lost packet recovery technique using convolutional coding in high speed networks, Dholakia, A.; Vouk, M.; Bitzer, D.; Military Communications Conference, 1993. MILCOM '93. Conference record. 'Communications on the Move'., IEEE, vol. 1, Oct. 11-14, 1993 pp. 318-322 vol. 1.

Method to recover Internet packet losses using (n, n-1, m) convolutional codes, Arai, M.; Yamaguchi, A.; Iwasaki, K. Dependable Systems and Networks, 2000. DSN 2000. Proceedings International Conference on, Jun. 25-28, 2000, pp. 382-389.

* cited by examiner

SYSTEMS AND METHODS FOR DECODING FORWARD ERROR CORRECTING CODES

BACKGROUND INFORMATION

In packet networks, non-real-time data signals and real-time data signals, such as voice, video, and audio, can be encoded with error correcting codes prior to being packetized and transmitted across the packet network. This can be accomplished through various forward error correction (FEC) schemes. In general, FEC schemes introduce sufficient redundancy in the signal (or message) to be sent so that packets lost or corrupted during transmission can be reconstructed at the receiver. In other words, the purpose of FEC is to improve the capacity of a channel by adding some carefully designed redundant information to the data being transmitted through the channel. The encoding of signals with error correcting codes can protect a transmitted signal against packet losses, packet erasures, bit errors, and also packet delay in the case of real-time signals.

At the receiving end of a transmission that has been encoded with an error correcting code and packetized, the arriving packets are typically first placed in a packet-receiving buffer (or 'playout' buffer). According to a 'pipelined' process, the buffered packets are read out (or 'played-out') of the buffer periodically, the bits or frames are extracted from the packet payloads, the bits or frames are decoded using a decoding method that corresponds to the encoding method that has been applied at the transmitting end prior to packetization, and the decoded digital signal is played-out to the receiving entity (a device, process, or person). Packets that arrive at the packet-receiving buffer when the buffer is already full, or, in the case of real-time signals, after a scheduled (or required) playout time has passed, may be discarded. The discarding of late packets causes the loss (or erasure) of the bits or frames contained in the late packets. The discarding of late packets is in addition to any packet loss, packet erasure, or packet corruption that may have already taken place in the packet network.

Bits or frames that are erased or lost may be indicated to the decoder, and the decoding method applied to the received bits or frames may correct erased, lost or corrupted bits or frames. However, even with FEC schemes in place, errors still occur in the decoding process. Therefore, systems and methods are still needed for improving the performance (i.e., the bit error rate) of forward error correcting codes.

BRIEF DESCRIPTION OF THE SEVERAL VIEWS OF THE DRAWING(S)

Reference will be made herein to the accompanying drawings, which are not necessarily drawn to scale, and wherein.

DETAILED DESCRIPTION OF PREFERRED EMBODIMENTS

The preferred embodiments according to the present invention now will be described hereinafter with reference to the accompanying drawings, in which some, but not all possible embodiments of the invention(s) are shown. Indeed, the invention(s) may be embodied in many different forms and should not be construed as limited to the embodiments set forth herein; rather, these embodiments are provided so that this disclosure will satisfy applicable legal requirements. Like numbers refer to like elements throughout.

In one embodiment implemented according to the present invention, a method and a system are disclosed for improving the performance of decoders of forward error correcting codes by using the information contained in late packet arrivals to update (or recompute) the state of the decoder. A well-known error correcting code that is referenced below by way of example is the convolutional error correcting code, although the method and system of embodiments according to the present invention can be employed with other error correcting codes as well. As described below, the method and system are generally applicable to decoders that maintain state information in decoding successive bits or information frames. One well-known decoder that maintains state information operates in accordance with the Viterbi algorithm, although the method and system may also be employed with other types of decoders. The method and system generally improve the performance (i.e., the bit error rate) of the decoder since the recomputed state is exactly the state that the decoder would have had if the information contained in the late packet had originally arrived on time and been decoded in a usual manner. In effect, the updating of the decoder state following a late packet arrival terminates the propagation in time of the effect of the late packet erasure on the state of the decoder.

The method and system described in more detail below are presented in terms of a decoder that is preceded by a packet-receiving buffer. Note that the size (in packets) of the packet-receiving buffer may be zero, one, or more. Hence, the described method and system also include the case where there is no receive buffer, in which case arriving bits or frames are immediately extracted from arriving packets and decoded in a pipelined process.

Figure 1:
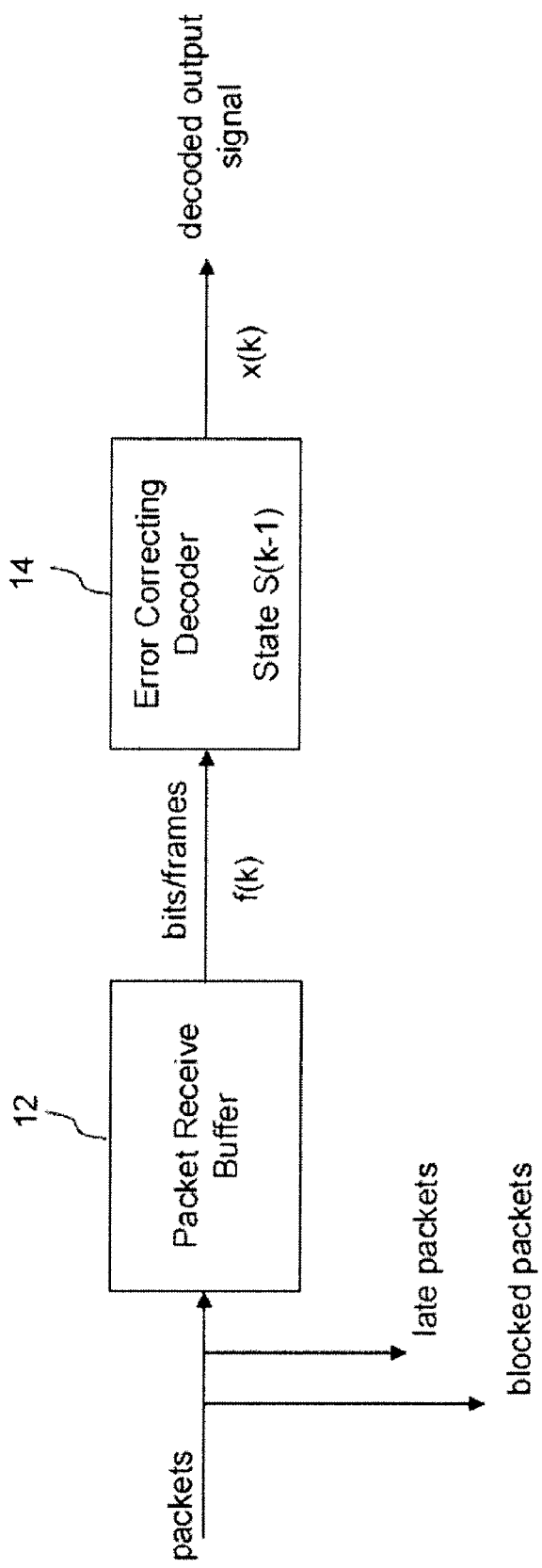
FIG. 1 illustrates a conventional technique for receiving packets and decoding information bits or frames that have been encoded with an error correcting code.

The usual technique for receiving packets and decoding information bits/frames that have been encoded with an error correcting code is shown in FIG. 1. In FIG. 1, the packets arriving from the network are typically first placed in a packet receive buffer 12. Packets that arrive at a full buffer are discarded (e.g., erased, blocked). Packets, e.g., late packets, that arrive after a scheduled or required playout time are also discarded. The packets being held in the receive buffer 12 are played-out according to a packet-playout schedule. As is commonly known, playout scheduling can be used at the receiving end of a transmission in order to continuously play out the transmitted signal (contained in the individual received packets) despite variations in network delays. With the existence of delay variations (also known as delay jitter), the playout scheme at the receiving end can greatly affect the tradeoff between loss and latency in packet networks. Thus, a packet receive buffer 12 is typically employed to absorb the delay jitter before outputting the decoded signal, x(k), where k denotes the discrete time epoch. Any packet arriving later than its scheduled (or required) playout deadline has to be discarded, resulting in loss. And while scheduling a later deadline increases the possibility of playing out more packets and lower loss rate, it does so at the cost of higher buffering delay.

When a packet is played out, the information bits/frames f(k) are extracted from the packet and the information bits/frames are decoded by the error correcting decoder 14 one bit or frame at a time (in some implementations, bits or frames may be decoded in groups). The output of the decoder 14 is the decoded output signal x(k). Note that if the packet buffer 12 is empty (starved) when a packet should be played out, or if one or more packets are missing from the time sequence of the packets in the packet buffer, such as a result of arriving late, then bit/frame erasure indicators will usually be inserted into the received bit/frame stream to maintain a continuous bit/frame stream of information into the decoder.

More formally, if f(k) is the kth information bit or frame (i.e., the bit or frame that arrives at the discrete time epoch k), then the decoded output signal corresponding to the kth time interval is x(k), where x(k)=D(f(k), S(k−1)), D(f(k) is the error correcting decoding operator, and S(k−1) is the state of the error correcting decoder 14 after having decoded the previous information frame f(k−1). The state of the decoder 14 after having decoded f(k) is then S(k). Note that, in the case of a bit, f(k) may correspond to a 1, 0, or an indicated erasure. In the case of a frame, f(k) may correspond to a frame of bits or an indicated frame erasure.

Figure 2:
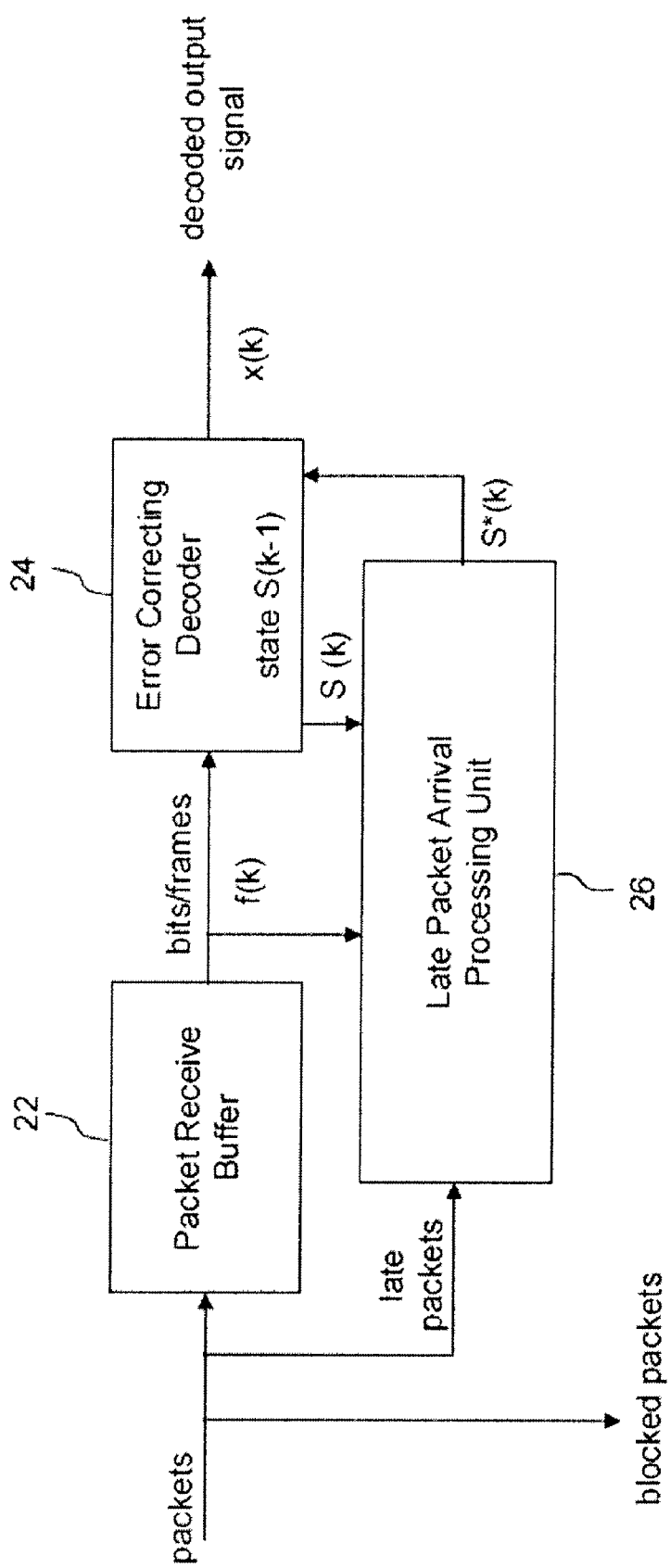
FIG. 2 shows a high level block diagram of an exemplary decoding technique implemented in accordance with one embodiment of the present invention.

As noted above, a conventional technique for receiving and decoding information bits/frames that have been encoded with an error correcting code suffers loss attributable to late arriving packets. In order to at least partially remedy this loss without increasing the buffering delay, FIG. 2 shows a high level block diagram of an exemplary decoding technique implemented in accordance with one embodiment of the present invention. More specifically, FIG. 2 illustrates a decoding technique that uses the information contained in late packet arrivals in decoding an error correcting code. In the conventional decoding technique of FIG. 1, late packet arrivals are simply discarded (or erased). In the embodiment depicted in FIG. 2, however, late packet arrivals are passed on to what can be referred to as a late packet arrival processing unit 26. As will be described in detail below, the information contained in late packet arrivals can be used by the late packet arrival processing unit 26 to update (or recompute) the state of the error correcting decoder 24. The late packet arrival processing unit 26 and its constituent elements as shown by way of example in FIG. 3 may be comprised of software that is stored in memory within the decoder and retrieved and executed by a processing element, such as a controller, microprocessor or other computing device, of the decoder. Alternatively, the late arrival processing unit 26 and its constituent elements may be comprised of hardware or firmware or any combination of software, hardware and firmware, as will be recognized by those skilled in the art.

Figure 3:
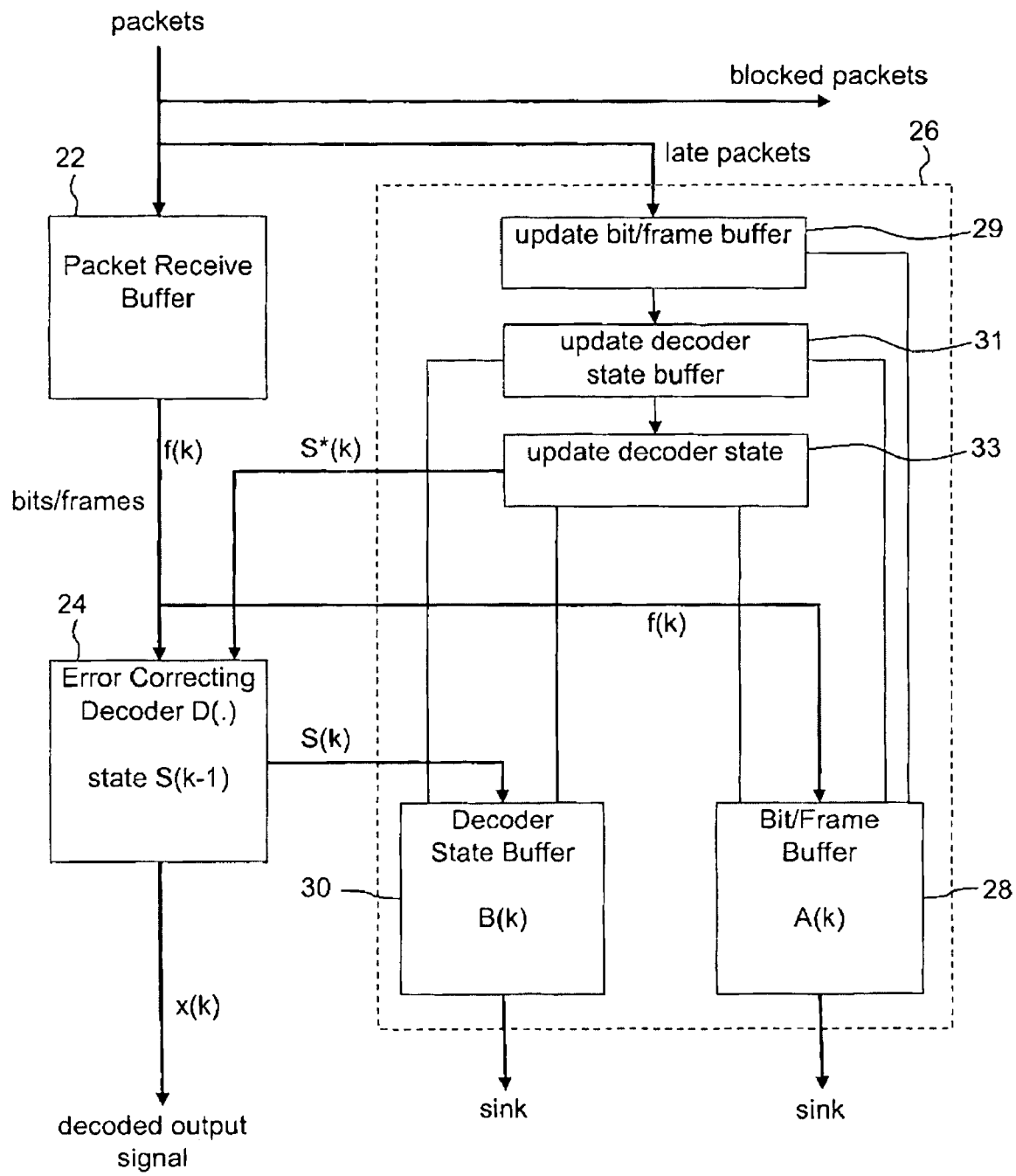
FIG. 3 shows a more detailed example of a decoding technique that can be implemented according to one embodiment of the present invention by using information contained in late packet arrivals in decoding an error correcting code.

FIG. 3 shows a more detailed example of a decoding technique that can be implemented according to one embodiment of the present invention by using the information contained in late packet arrivals in decoding a forward error correcting code. In FIG. 3, packets arriving from a network are first placed in a packet receive buffer 22 unless they arrive past their scheduled (or required) playout time or unless the packet receive buffer is full. If the packet receive buffer 22 is full, the arriving packet may be simply discarded or blocked. As in FIG. 1, the packets in the packet receive buffer 22 are played-out according to a packet-playout schedule. When a packet is played out, the information bits/frames are extracted from the packet and the information bits/frames are decoded by the error correcting decoder 24 one bit/frame at a time (or, in some implementations, in groups of bits/frames). The output of the decoder 24 is the decoded output signal x(k), where x(k)=D(f(k), S(k−1)). If the packet buffer 22 is empty (starved) when a packet should be played out, then erasure bits/frames can be inserted to maintain a continuous information stream into the decoder 24.

Unlike the conventional technique depicted in FIG. 1, the embodiment shown in FIG. 3 includes a late packet arrival processing unit 26 which assists in implementing a set of additional steps that may be carried out when a late packet arrives. In the conventional technique of FIG. 1, a late packet is simply discarded (or erased). In the exemplary embodiment of FIG. 3, however, the bit/frame information in late packet arrivals can be used to: (i) update an auxiliary bit/frame buffer 28 as indicated at step 29; (ii) update an auxiliary decoder state buffer 30 as indicated at step 31; and (iii) update the error correcting decoder state S(k) as indicated at step 33. The bit/frame buffer 28 holds the latest M−1 input bits/frames, including bit/frame erasure indications that may have been inserted when the packet buffer was starved. In other words, the bit/frame buffer 28 holds the recent history of bits/frames that have been presented to the error correcting decoder 24. As bits/frames are presented to the error correcting decoder 24, the bits/frames are also copied into the bit/frame buffer 28. The state of the bit/frame buffer 28 at time k can therefore be defined to be the set of bits/frames A(k)={f(k), f(k−1), . . . , f(k−M)}. The decoder state buffer 30 holds the latest M states of the error correcting decoder 24. In other words, the decoder state buffer 30 holds the recent history of decoder states. As the state of the decoder 24 changes in decoding successive bits/frames, each new state of the decoder is also copied into the decoder state buffer 30. The state of the decoder state buffer 30 at time k may therefore be defined to be the set of decoder states B(k)=(S(k), S(k−1), . . . , S(k−M−1)).

When a late packet arrives, the late packet arrival processing unit 26 generally first determines the time epochs to which the bits/frames in the late packet correspond during the step 29 of updating the bit/frame buffer. This may be determined from sequence number and/or timestamp information contained in the header field(s) of the late packet. The set g(.) of bits/frames in the late packet is then given by {g(e), g(e+1), . . . , g(e+n−1)}, wherein n is the number of bits/frames in the late packet and e is the time epoch of the first bit/frame in the late packet. The bit/frame buffer A(k) (28) is then updated by replacing those bit(s)/frame(s) in A(k) that correspond to the same time epochs as does the late packet. For example, f(e) may be replaced by g(e) if f(e) is in A(k), f(e+1) may be replaced by g(e+1) if f(e+1) is in A(k), . . . , and f(e+n−1) may be replaced by g(e+n−1) if f(e+n−1) is in A(k). As noted above, erasure bits/frames may be initially inserted in the bit/frame buffer A(k) in lieu of a late arriving packet to maintain a continuous information stream to the decoder 24. As such, if f(i) is in A(k) and g(i) is contained in a late packet, then f(i) was an indicated bit/frame erasure that primarily served as a placeholder for an erasure. Following updating to include the late arriving packet, the contents of the bit/frame buffer 28 may be defined as A*(k)={f*(k), f*(k−1), . . . , f*(k−M)}.

Having updated the bit/frame buffer 28, the decoder state buffer 30 is then updated by recursively recomputing (updating) the past decoder states taking into account the updated bit/frame buffer A*(k). In this regard, let f(j) be the earliest bit/frame in A(k) that was replaced by g(j) in updating the bit/frame buffer 28. Then the decoder state buffer 30 is updated recursively by recomputing S(j) as S*(j)=D(f*(j), S(j−1)), recomputing S(j+1) as S*(j+1)=D(f*(j+1), S*(j)), and so on, until S(k) is recomputed as S*(k)=D(f*(k), S*(k−1)). Finally, the present state of the decoder 24 itself is updated by setting it to the recomputed (updated) state S*(k). The performance of the decoder 24, at least in terms of bit error rate, may therefore be improved since the recomputed state of the decoder is the same state that the decoder would have had if the information contained in the late packet had originally arrived on time and been decoded in a typical manner. By updating the state of the decoder upon receiving the late packet, the method and system of the preferred embodiments according to the present invention may terminate the propagation in time of the deleterious effect of the late packet erasure on the state of the decoder.

As has already been noted above, embodiments implemented according to the present invention that use the information contained in late packet arrivals can be used with error correcting decoders that maintain state information in decoding successive bits/frames. One example is the Viterbi decoder for convolutional error correcting codes. Embodiments of the present invention, however, are in no way limited in their applicability to any particular error correcting coding scheme or decoding scheme, so long as the decoder maintains state information in decoding successive bits/frames. There exist many other examples of such decoders to which the method and system of embodiments of the present invention may be applied, such as decoders for convolutional turbo codes. The embodiments and examples described herein may also be applied to any new error correcting decoders that may be invented in the future that maintain state information in decoding successive bits/frames.

In the preceding specification, the invention has been described with reference to specific exemplary embodiments thereof. It will, however, be evident that various modifications and changes may be made thereunto without departing from the broader spirit and scope of the invention as set forth in the claims that follow. The specification and drawings are accordingly to be regarded in an illustrative rather than restrictive sense.

That which is claimed is:

1. A packet decoding system, comprising:
    a forward error correcting decoder configured to decode received packets that contain information coded with a forward error correcting code, and maintain state information representative of a series of states of the forward error correcting decoder following the decoding of the information contained by the received packets; and
    a late-packet-arrival processing unit configured to update the state information of the forward error correcting decoder based at least in part on information contained in a late packet that arrives at the packet decoding system following a predefined playout time, said late packet arrival processing unit including
        (i) a bit/frame buffer configured to store a recent history of the information that has been presented to the forward error correcting decoder; and
        (ii) a bit/frame-buffer update unit configured to update the bit/frame buffer in response to the arrival of the late packet.

2. The system of claim 1, wherein the bit/frame-buffer update unit is configured to determine at least one time epoch to which the information in the late packet corresponds, and replace any existing entries in the bit/frame buffer that correspond to such time epochs with the corresponding information in the late packet.

3. The system of claim 1, wherein the late-packet-arrival processing unit further comprises:
    a decoder state buffer configured to store a recent history of the states of the forward error correcting decoder; and
    a decoder-state-buffer update unit configured to update the decoder state buffer based at least in part on the updated information in the bit/frame buffer, wherein the updated information in the bit/frame buffer is based at least in part on information contained in the late packet.

4. The system of claim 3, wherein the decoder-state-buffer update unit is configured to update the decoder state buffer by recursively recomputing past states of the forward error correcting decoder based at least in part on the updated information in the bit/frame buffer.

5. The system of claim 1, wherein said forward error correcting decoder is a Viterbi decoder configured to decode information encoded with convolutional error correcting codes.

6. The system of claim 1, further comprising a packet receive buffer configured to receive and buffer received packets before presented to the forward error correcting decoder.

7. A method, comprising:
    decoding information contained in a plurality of received packets that have been coded using a forward error correction code;
    maintaining state information representative of a series of states following the decoding of the information contained by each of the plurality of received packets;
    receiving a late packet that arrives following a predefined playout time and that also comprises information coded using the forward error correcting code; and
    updating the state information based at least in part on information contained in the late packet including updating a bit/frame buffer based at least in part on the information contained in the late packet, wherein the bit/frame buffer holds a recent history of the information that has been decoded.

8. The method of claim 7, wherein updating the bit/frame buffer comprises determining time epochs to which the information in the late packet corresponds, and replacing any existing entries in the bit/frame buffer that corresponds to the time epochs with the corresponding information in the late packet.

9. The method of claim 7, wherein updating the state information further comprises updating a decoder state buffer based at least in part on the updated information in the bit/frame buffer, wherein the decoder state buffer holds a recent history of the state information.

10. The method of claim 9, wherein updating the decoder state buffer comprises recursively recomputing the past state information based at least in part on the updated information in the bit/frame buffer.

11. The method of claim 7, wherein the forward error correction code is a convolutional error correcting code.

12. The method of claim 7, further comprising buffering the plurality of received packets before the information contained in the plurality of received packets is decoded.

13. A packet decoding system, comprising:
    a forward error correcting decoder configured to decode received packets that contain information coded with a forward error correcting code, and maintain state information representative of a series of states of the forward error correcting decoder following the decoding of the information contained by the received packets;
    a bit/frame buffer configured to store a recent history of the information that has been presented to the forward error correcting decoder;
    a decoder state buffer configured to store a recent history of the states of the forward error correcting decoder;

a bit/frame-buffer update unit configured to update the bit/frame buffer in response to an arrival of a late packet that arrives at the packet decoding system following a predefined playout time, the late packet containing late packet information;

a decoder-state-buffer update unit configured to update the decoder state buffer based at least in part on the updated information in the bit/frame buffer; and a decoder-state update unit configured to update the state information of the forward error correcting decoder based at least in part on the updated information in the decoder state buffer and the updated information in the bit/frame buffer.

14. The system of claim 13, wherein the bit/frame-buffer update unit is configured to determine the epochs to which the late packet information in the late packet correspond, and replacing any existing entries in the bit/frame buffer that corresponds to the time epochs with the late packet information.

15. The system of claim 13, wherein the decoder-state-buffer update unit is configured to recursively recompute the past decoder states based at least in part on the updated information in the bit/frame buffer.

16. The system of claim 13, wherein the forward error correcting decoder is a Viterbi decoder configured to decode information encoded with convolutional error correcting codes.

17. The system of claim 13, further comprising a packet receive buffer configured to receive and buffer received packets before presented to the forward error correcting decoder.

* * * * *